United States Patent
Hase

(10) Patent No.: US 10,330,704 B2
(45) Date of Patent: Jun. 25, 2019

(54) SYSTEM OF ELECTRICAL FIXTURES WITH INTEGRAL CURRENT MONITORING, TELEMETRY, REMOTE CONTROL, SAFETY AND SENSORY FEATURES

(71) Applicant: Karl E. Hase, Corvallis, OR (US)

(72) Inventor: Karl E. Hase, Corvallis, OR (US)

( * ) Notice: Subject to any disclaimer, the term of this patent is extended or adjusted under 35 U.S.C. 154(b) by 108 days.

(21) Appl. No.: 15/246,904

(22) Filed: Aug. 25, 2016

(65) Prior Publication Data
US 2018/0059175 A1 Mar. 1, 2018

(51) Int. Cl.
| | | |
|---|---|---|
| *G01R 11/00* | (2006.01) | |
| *G01R 21/06* | (2006.01) | |
| *G01D 4/00* | (2006.01) | |
| *G01R 15/14* | (2006.01) | |
| *G01R 31/02* | (2006.01) | |
| *G01R 21/133* | (2006.01) | |
| *G01V 11/00* | (2006.01) | |
| *G01R 22/06* | (2006.01) | |

(52) U.S. Cl.
CPC ............ *G01R 11/00* (2013.01); *G01D 4/002* (2013.01); *G01R 15/14* (2013.01); *G01R 21/06* (2013.01); *G01R 21/133* (2013.01); *G01R 31/025* (2013.01); *G01R 22/063* (2013.01); *G01V 11/00* (2013.01)

(58) Field of Classification Search
CPC ........ G01R 11/00; G01R 21/00; G01R 21/06; G01R 22/00
USPC ........................... 324/103 P, 103 R, 713, 536
See application file for complete search history.

(56) References Cited

U.S. PATENT DOCUMENTS

| | | |
|---|---|---|
| 4,977,513 A | 12/1990 | LaPalme |
| 5,185,684 A | 2/1993 | Beihoff et al. |
| 5,206,596 A | 4/1993 | Beihoff et al. |
| 5,223,795 A | 6/1993 | Blades |
| 5,224,006 A | 6/1993 | MacKenzie |
| 5,420,740 A | 5/1995 | MacKenzie |
| 5,432,455 A | 7/1995 | Blades |
| 5,590,012 A | 12/1996 | Dollar, II |
| 5,729,145 A | 3/1998 | Blades |
| 5,905,422 A | 5/1999 | Doneghue |

(Continued)

FOREIGN PATENT DOCUMENTS

EP 1103057 10/2008

*Primary Examiner* — Amy He
(74) *Attorney, Agent, or Firm* — Ater Wynne LLP

(57) ABSTRACT

An electrical safety product circuit topology and its equivalent variations for sensing, control, and reporting of household AC wall current, voltage, power, and energy use, and status of its Ground-and-Arc-Fault-Interrupting internal circuit breaker, is presented herein. The architecture includes any choice of telemetry platform, presumes a plurality of its kind join a wireless network with a plurality of other products endowed with the same platform faculty. Topology variations claimed include current and differential current sensing by toroid or other transformer or by Hall semiconductor means, and include fault condition recognition by microprocessor-based algorithms, or by various analog circuit or digital signal processing (DSP) means. Embodiment variations claimed include any modular circuit breaker panel component form factor, any in-wall outlet or switch-box form factor, and any plug-in AC socket module, in-cord module, and outlet strip form factor.

17 Claims, 11 Drawing Sheets

(56) References Cited

U.S. PATENT DOCUMENTS

| | | | |
|---|---|---|---|
| 5,982,103 A | 11/1999 | Mosebrook et al. | |
| 6,141,197 A | 10/2000 | Kim et al. | |
| 6,414,829 B1 | 7/2002 | Haun et al. | |
| 6,433,977 B1 | 8/2002 | MacBeth | |
| 6,807,035 B1 * | 10/2004 | Baldwin | H02H 3/335 |
| | | | 361/42 |
| 6,839,208 B2 | 1/2005 | MacBeth et al. | |
| 7,619,861 B2 * | 11/2009 | Weeks | H01H 71/02 |
| | | | 335/18 |
| 7,737,809 B2 | 6/2010 | Germain et al. | |
| 7,911,746 B2 | 3/2011 | Zaretsky | |
| 8,009,042 B2 * | 8/2011 | Steiner | H05B 37/0227 |
| | | | 315/159 |
| 8,093,751 B1 | 1/2012 | Puschnigg | |
| 8,447,541 B2 | 5/2013 | Rada | |
| 8,649,987 B2 | 2/2014 | Steenberg | |
| 8,797,723 B2 * | 8/2014 | Hilton | H02G 3/14 |
| | | | 315/159 |
| 9,077,434 B2 | 7/2015 | Kasprzyk | |
| 9,083,180 B2 * | 7/2015 | Dodal | H02H 3/16 |
| 9,331,524 B1 | 5/2016 | Yetter | |
| 2003/0158677 A1 * | 8/2003 | Swarztrauber | G01D 4/008 |
| | | | 702/62 |
| 2009/0014460 A1 * | 1/2009 | Kobus, II | G06Q 20/127 |
| | | | 221/135 |
| 2015/0227149 A1 | 8/2015 | Makanawala | |

\* cited by examiner

HUB Firmware Flow

```
Loop: Update Timer;
      If( TimeFor.Sampling )
          Read.ADC.AvgLineVoltage;
      If( AvgLineVoltage.Lost )            /* Hub may be the only fixture with a battery */
          SetPwrLostFlag.Fixture.0;        /* able to report main power lost, radio silent */

Loop ( i = 1 to Fixture.Last ) :     /* poll all radio fixtures to collect monitor data */
      {                                    /* and assert control changes as net directs */
         If( Net.Cmnd.Fixture.i )
             SendCmnd.RadioChnl(i);
         If( MsgRcvd.RadioChnl(i) )
             SetStates.Fixture.i;
      }

If( NetRequestRcvd.Fixture.i )       /* serve monitor data to network client */
          NetSendStates.Fixture.i;

If( NetCmndMsgRcvd.Fixture.i )
          SetNewValues.Fixture.i;
```
Repeat Loop Forever

Fig. 8

| Fixture Type: | Radio Type: | Controls: |
|---|---|---|
| ☐ NEMA5 Plug-In Adapter | ■ Z-Wave | ■ Triac Dimmer |
| ■ NEMA5 Duplex Outlet | ☐ Wi-Fi | ☐ One Pole Relay |
| ☐ NEMA5 Quad Outlet | ☐ Bluetooth | ■ Two Pole Relay |
| ☐ NEMA5 Wall Switch | ☐ Zigbee | ☐ Three Pole Relay |
| ☐ NEMA5 Buried Switch | ☐ X10 | ☐ Night-Light |
| ☐ NEMA14 Single Outlet | ☐ other | |
| ☐ NEMA14 Buried Monitor | | Sensors: |
| ☐ Panel Clamp-On Monitor | | ■ Line1 Voltage Sensor |
| ☐ Panel Circuit Breaker | | ☐ Line2 Voltage Sensor |
| | | ■ Line1 Hall Current Sensor |
| | Safety Special Features: | ☐ Line2 Hall Current Sensor |
| Fixture Size: | ■ DSP Present | ■ Neut Hall Current Sensor |
| ☐ 10A | ☐ GFCI code | ☐ Toroid Diff Cur Sensor |
| ■ 15A | ■ AFCI code | ☐ Toroid Sum Cur Sensor |
| ☐ 20A | ☐ GFCI chip | ☐ Hand Switch (2 sensors) |
| ☐ 30A | ☐ Extended Range Antenna | ☐ Swipe Sw (3-10 sensors) |
| ☐ 50A | ☐ Backup Battery | ☐ Ambient Light Sensor |
| | | ☐ Person-In-Room Sensor |

Configuration Control Attributes - Fixed and Settable Examples

Table 1

Fig. 11

SYSTEM OF ELECTRICAL FIXTURES WITH INTEGRAL CURRENT MONITORING, TELEMETRY, REMOTE CONTROL, SAFETY AND SENSORY FEATURES

FIELD OF THE INVENTION

The invention relates to AC electrical power delivery devices endowed with current monitoring and control capabilities and in particular to consumer, commercial, and industrial Outlets and adapters suitable for measuring energy usage and transmitting that data to a remote reporting and or recording station by wired or wireless means, and receiving in return commands to turn connected loads on or off, or to dim/brighten by degree for lighting loads.

The invention holds that each such device embeds its own microcontroller(s), wired or wireless communication electronics, AC current interruption and modulation circuits, and AC current and voltage sensing circuits which variously present AC waveforms or their DC filtered representations as signals to the microcontroller(s) and/or dedicated signal processing circuits which then calculate power and track energy use as instantaneous and/or time-accumulated values, and control the flow of current to connected loads.

The invention includes a scheme of general and specific circuit design variations and microcontroller firmware variations which may together effect this electricity usage monitoring and control, employing any one of several wired or wireless communication protocols and PHY (hardware) methods.

The invention holds further that each such device may additionally effect ground fault detection and/or arc fault detection and subsequent circuit interruption, using these same and additional sensing circuits, microcontrollers and firmware, defining the invention as electrical safety products also, specifically as ground-fault-interrupter (GFI)-protected and/or arc-fault-interrupter (AFI)-protected wall outlets, adapters, and circuit breakers.

The invention further includes a scheme of general and specific circuit design variations and microcontroller firmware variations which may together effect this electrical safety function and the monitoring, testing, and reset thereof, employing the same wired or wireless communication protocols and PHY (hardware) methods as aforementioned for electricity usage monitoring and control.

The invention therefore is a new class of integrated electrical safety and energy usage monitoring and control product which embeds any telemetry means by which a building supervisory network gains integration of, and specifically monitoring of the actions of, GFI and AFI electrical safety functionality as well as load control and energy use monitoring, in home, office, factory, and other buildings.

BACKGROUND OF THE INVENTION

Embodiments found within the prior art generally divide into two separate product categories that do not as yet overlap:
  Non-Safety: Permanent wall-box switches and outlets and removable plug-in adapter outlet devices endowed with monitoring/control function(s) and/or one or another wireless protocol faculty, but which have no GFI nor AFI (a.k.a. GFCI/AFCI) safety function.
  Safety: Permanent wall-box outlets and breaker-panel circuit breakers endowed with GFI or AFI safety function(s) but which have no wireless faculty and no energy monitoring function.

As a result, installing a wireless monitoring/control outlet in an existing wall outlet box may mean removing an existing GFCI or AFCI outlet without the option of also retaining the safety functionality along with the added telemetry features.

When the GFI or AFI safety function is provided by a circuit breaker in a panel, adding the telemetry feature at an outlet cannot provide telemetry of the GFI/AFI interrupter status, nor the ability to remotely test or reset it. Instead, loss of AC branch circuit voltage due to a GFI/AFI breaker trip results in only radio silence (lack of any telemetry) from a telemetry-endowed outlet or other device on the circuit.

From the telemetry network's perspective, a breaker trip is thus indistinguishable from a utility power outage, and from other failures in the telemetry-endowed device, provides no diagnostic information, and allows no remote corrective action. A telemetry-endowed circuit breaker would be able to distinguish among these situations to actively report.

As a family of submetering devices, the goal of this new art is to increase the resolution of measurement of electrical energy use within a building, to the branch circuit and even outlet/fixture level (plug-load control and monitoring). The new art disclosed here integrates safety and submetering in a building sub-network.

BRIEF SUMMARY OF THE INVENTION

A highly configurable electrical wall fixture with energy use monitoring and wireless telemetry for remote trending and on/off and dimming control, combined GFI and/or AFI protection, nightlight and ambient light and motion sensors, is presented as new art, as may be embodied variously in a permanently wall-box-installed outlet or manual switch device, or as a plug-in adapter requiring no tools to add these features at an existing wall outlet.

Various NEMA5 and NEMA14 fixtures are the preferred embodiments of this invention, some presented for user access, exposed on a wall, floor, or ceiling, and others "buried" within a wall, floor, or ceiling and accessed by communication network command only.

Furthermore, the fixture's core integration of energy use monitoring, wireless telemetry, and AFCI/GFCI protection may instead be embodied in a breaker-panel modular circuit breaker, also given here as new art.

Finally, for connection to existing networks common among Building Management Automation and Control Systems (BMACS), the invention includes a data Gateway Hub to serve as connectivity means and protocol adapter between the wired or wireless network among fixtures of the invention, and a BMACS network.

Other novel features which are characteristics of the invention, as to organization and method of operation, together with further and advantages thereof will be better understood from the following description considered in connection with the accompanying Figs., in which preferred embodiments of the invention are illustrated by way of example. It is to be expressly understood, however, that the Figs. are for illustration and description only and are not intended as a definition of the limits of the invention. The various features of novelty which characterize the invention are pointed out with particularity in the following description. The invention resides not in any one of these features taken alone, but rather in the particular combination of all of its structures for the functions specified.

fixture embodiments of the invention, illustrating all necessary and optional components and functionalities claimed.

Figure 1:
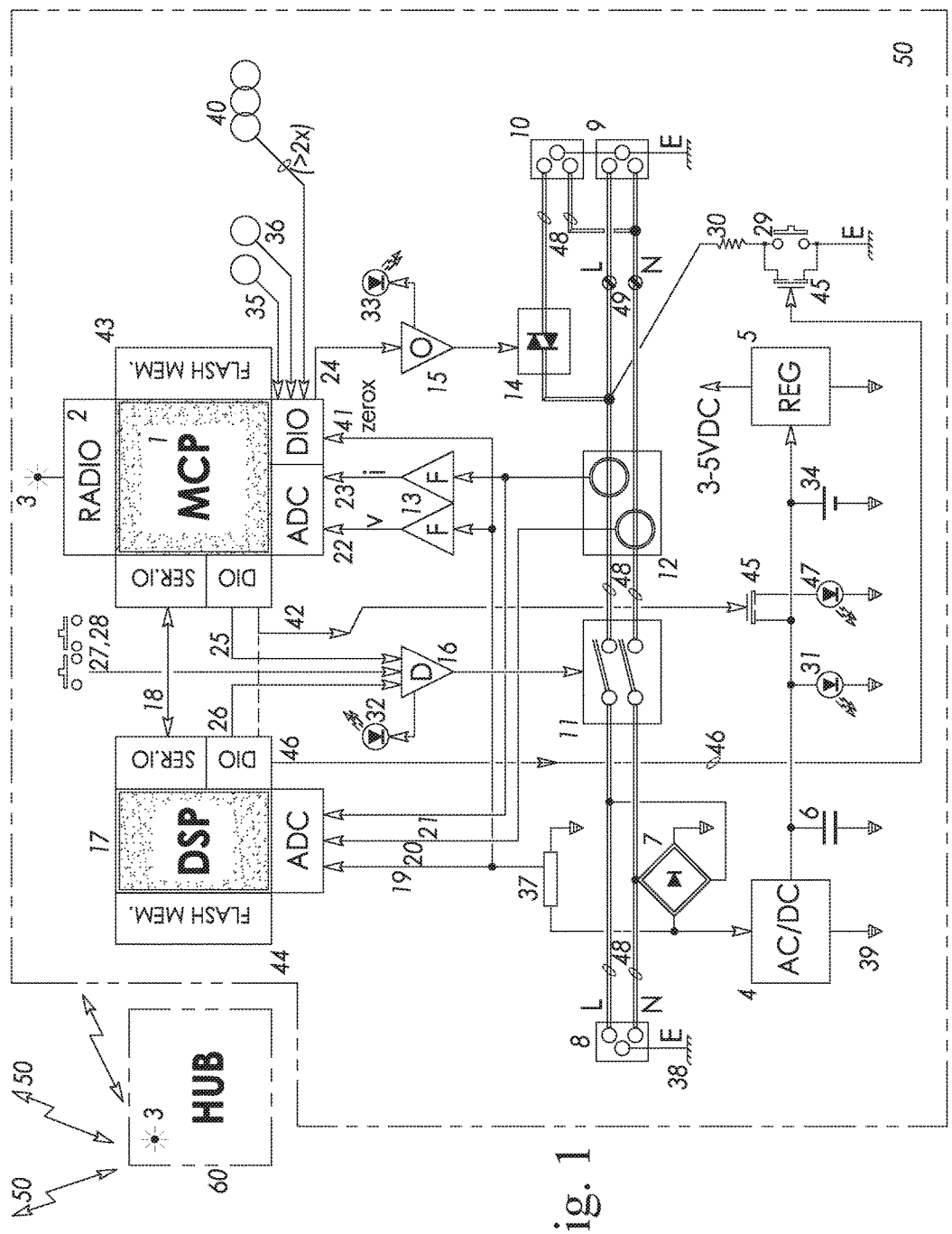
FIG. 1 depicts the electrical circuit functional block diagram for the generalized NEMA5 two-pole (single phase)
Figure 2:
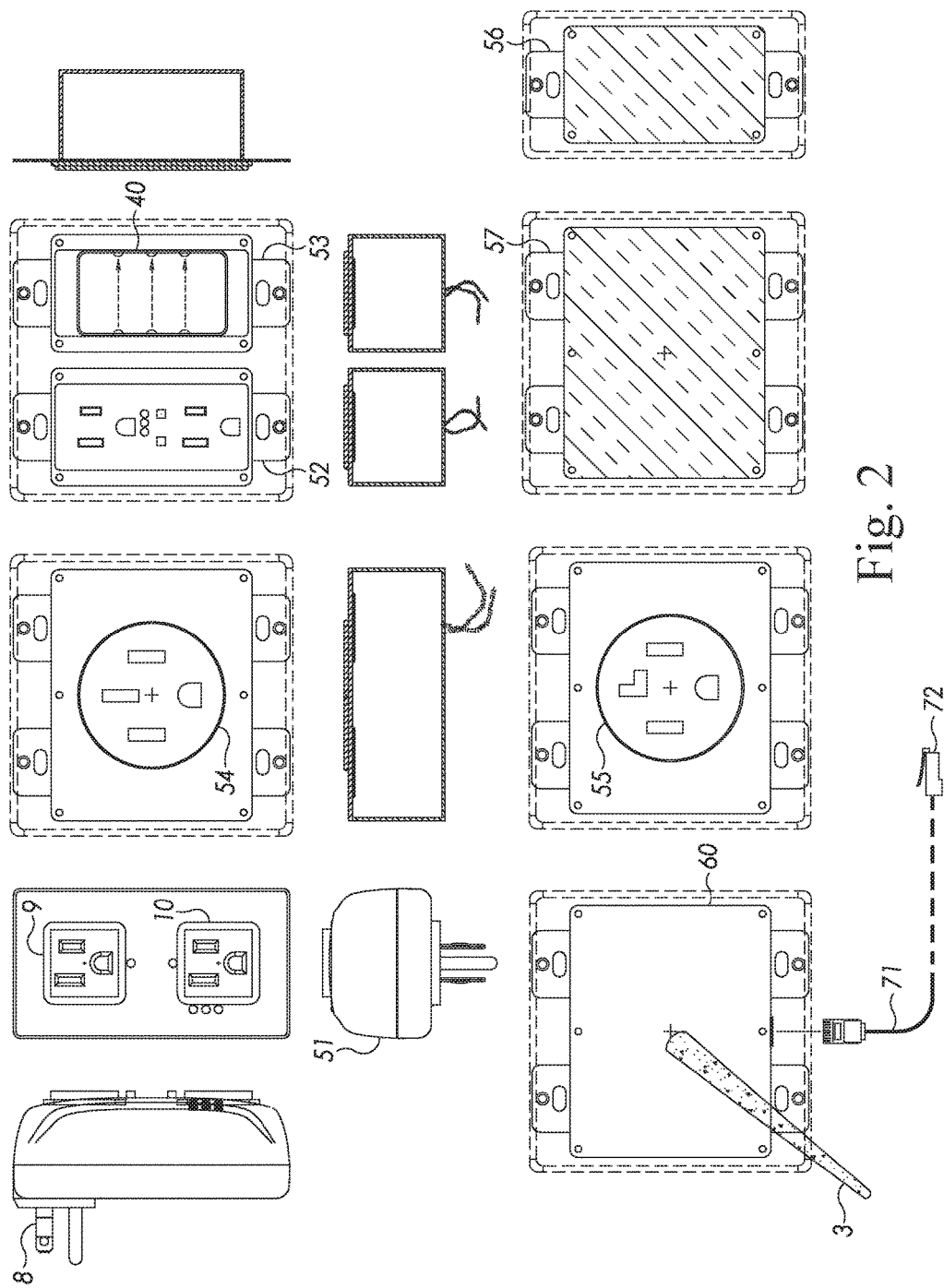
Figure 3:
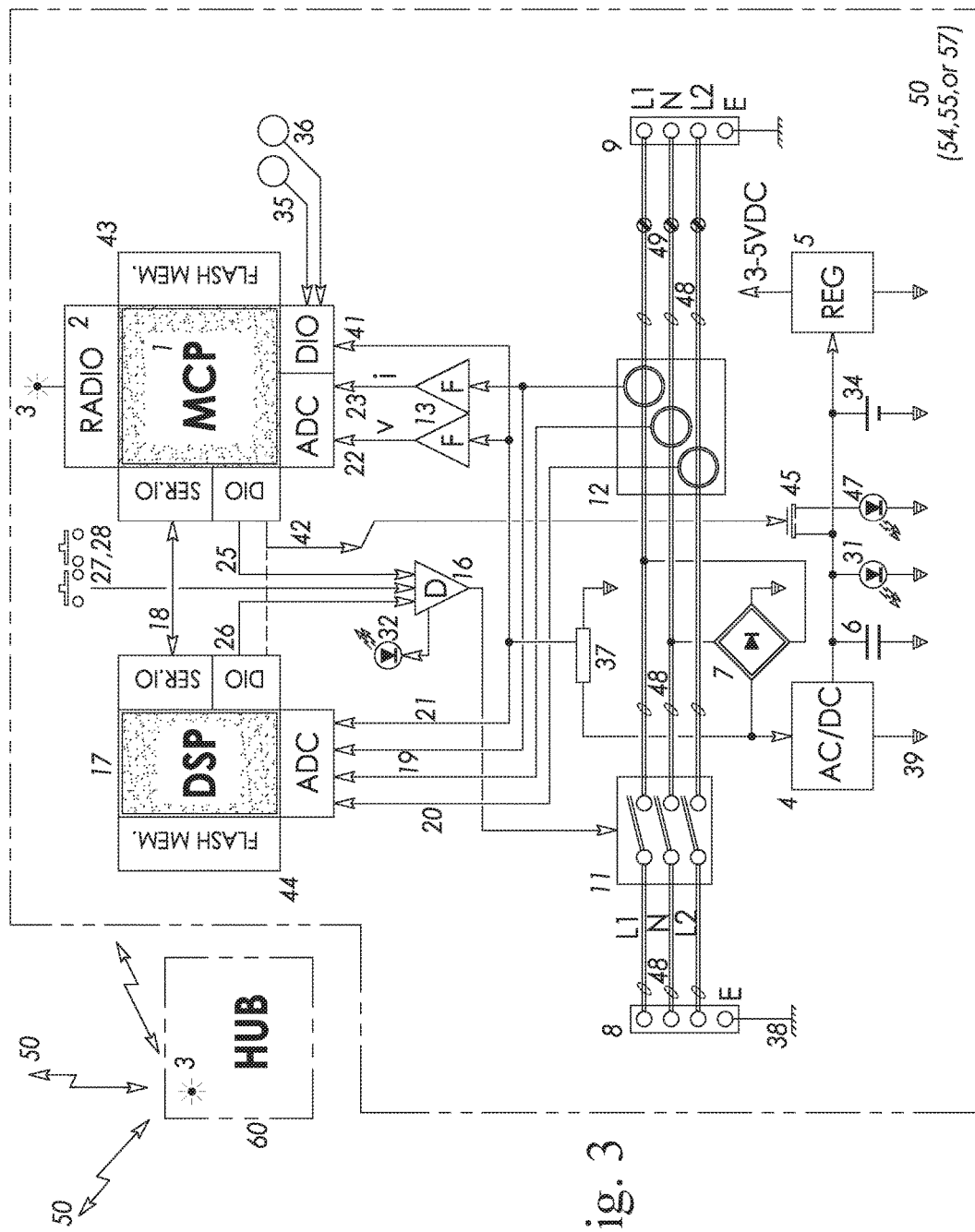
Figure 5:
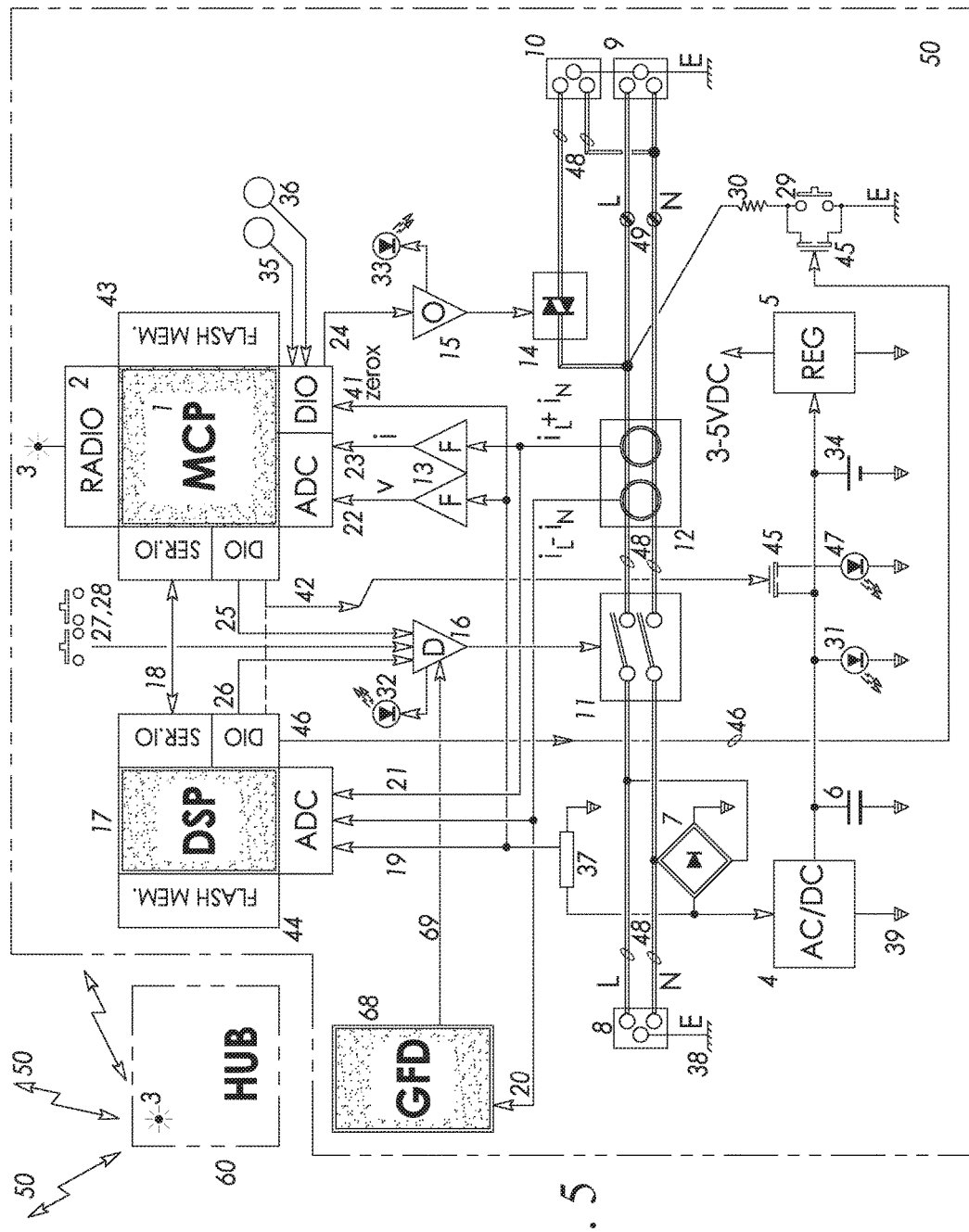
Figure 7:
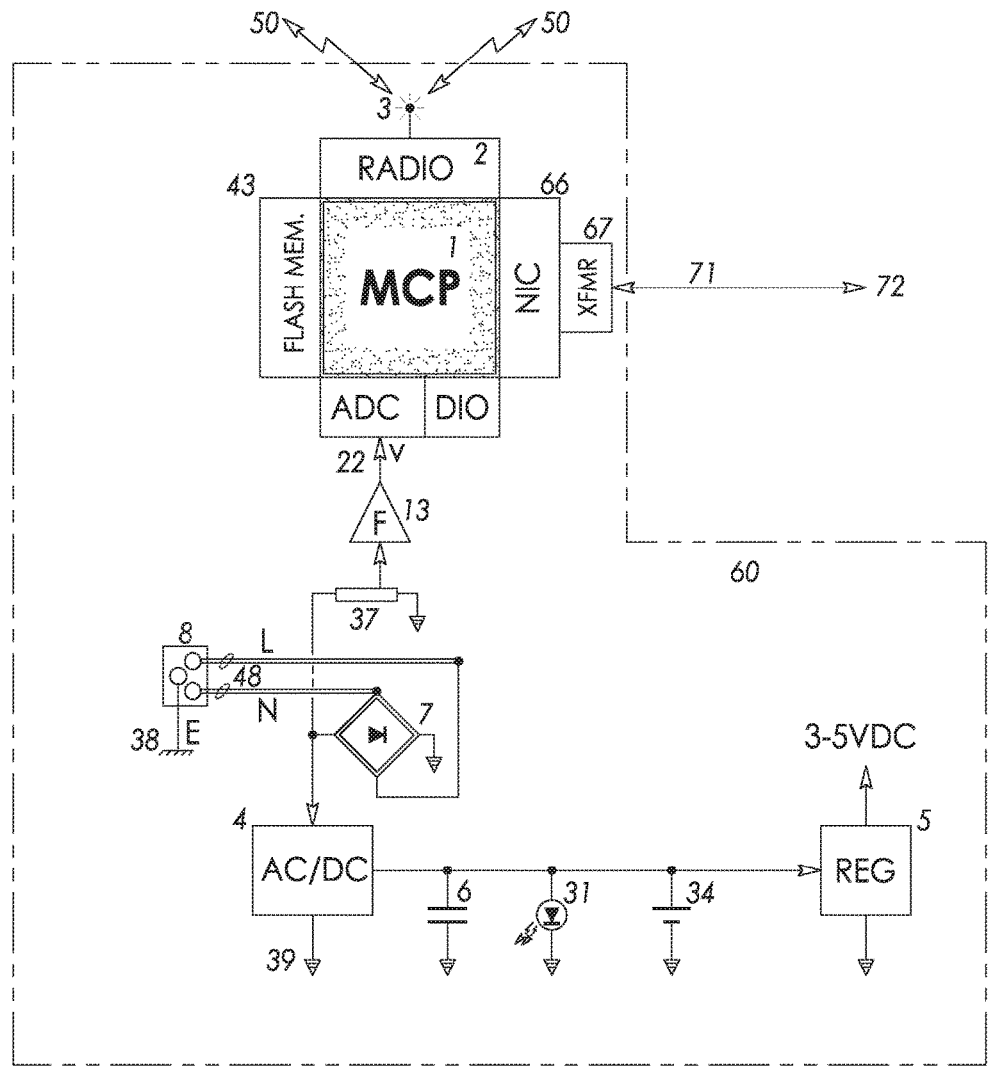

FIG. 2 depicts various electrical fixture embodiments of the invention, endowed with the functions and components of the NEMA5 outlets, adapters, wall switches and buried monitoring control fixtures of FIG. 1 and FIG. 5 and of the NEMA14 outlets and buried monitoring control fixtures of FIG. 3 and FIG. 7.

FIG. 3 depicts the electrical circuit function block diagram for the generalized NEMA14 three-pole (two-phase) fixture embodiments of the invention, illustrating all necessary and optional components and functionalities claimed.

Figure 4:
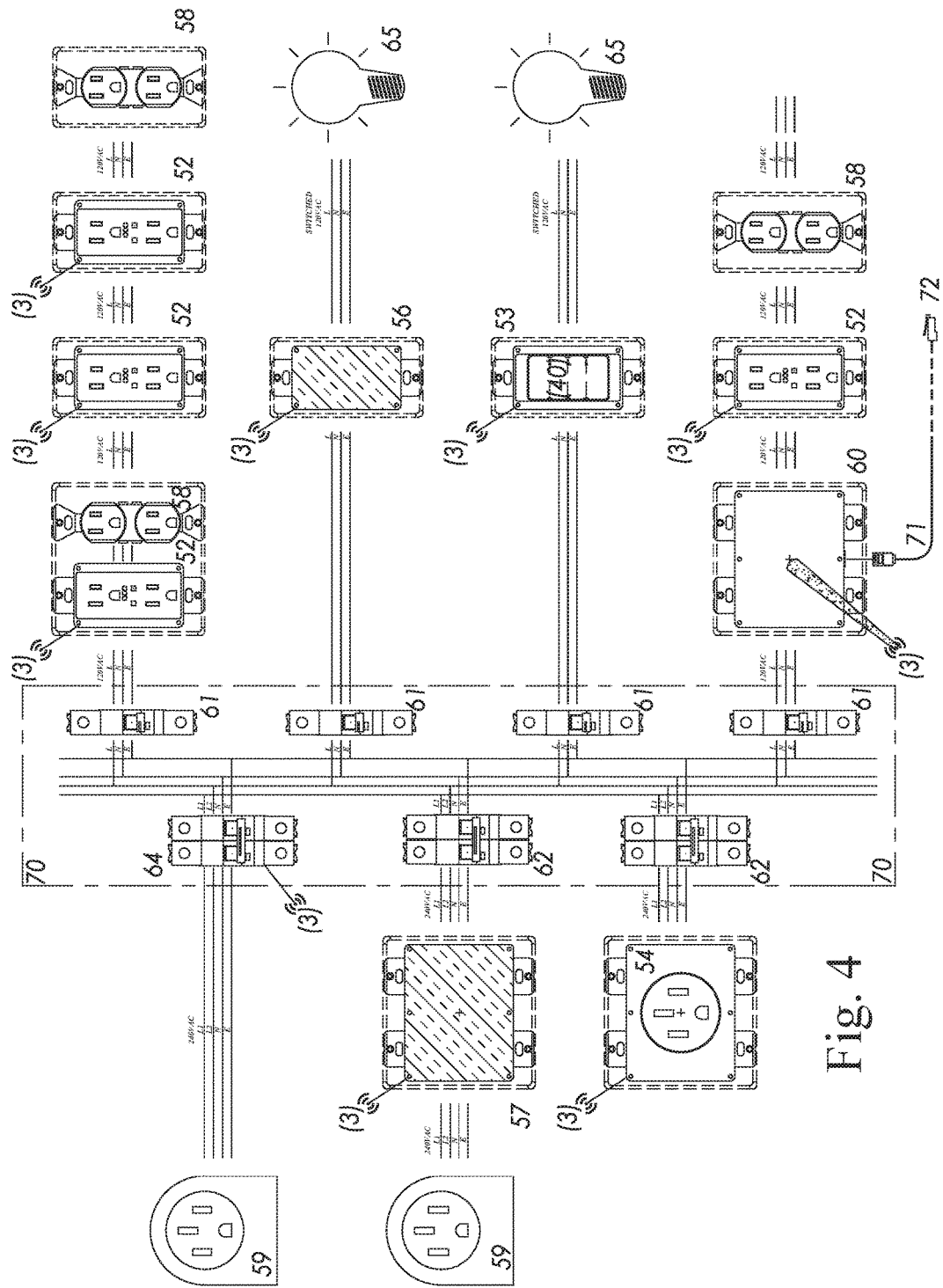

FIG. 4 exemplifies various NEMA5 and NEMA14 embodiments of the invention depicted in their respective branch wiring applications, as a subsystem central to a building data network gateway hub.

FIG. 5 depicts the adaptation to this invention of the most common current sensing and GFCI detection devices, readily available specialized circuit components hereby put to additionally novel use by this invention's integration as new art.

Figure 6:
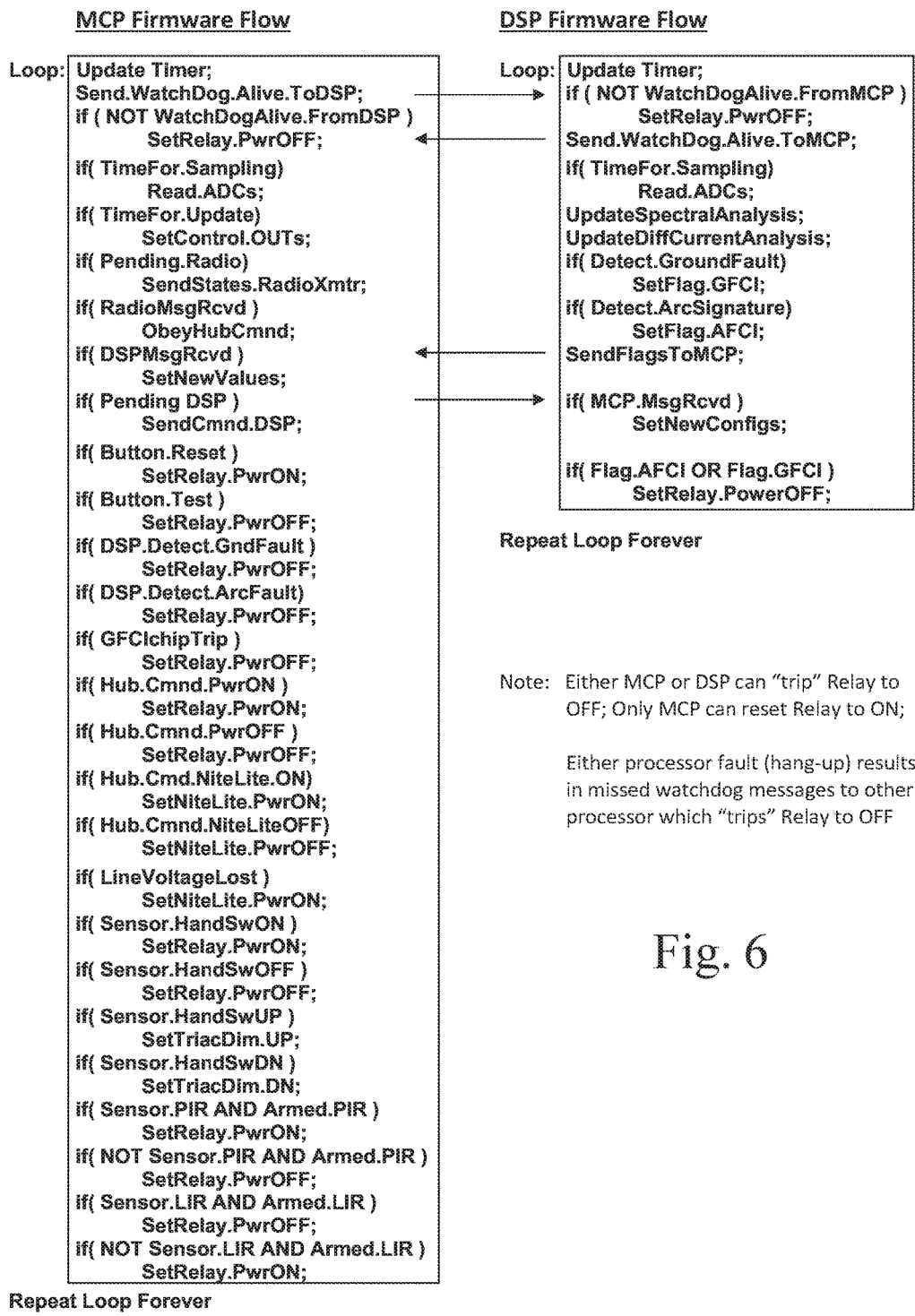

FIG. 6 summarily depicts the firmware program flow in the two microprocessors of FIGS. 1, 3, and 5 as pseudo-code steps for the data acquisition and communication operations within the invention.

FIG. 7 depicts the block diagram of a generalized Gateway Hub central to the invention's wireless network of fixtures, serving to collate fixture telemetry data onto BMACS wired networks such as BACnet, or to a local user interface when the invention is used for example in a home.

FIG. 8 summarily depicts the firmware (or software) program flow for the remote gateway hub central to the invention, as pseudo-code steps for polling a plurality of submetering fixtures to collect data it then provides as a server to building wired network clients external to the invention.

Figure 9:
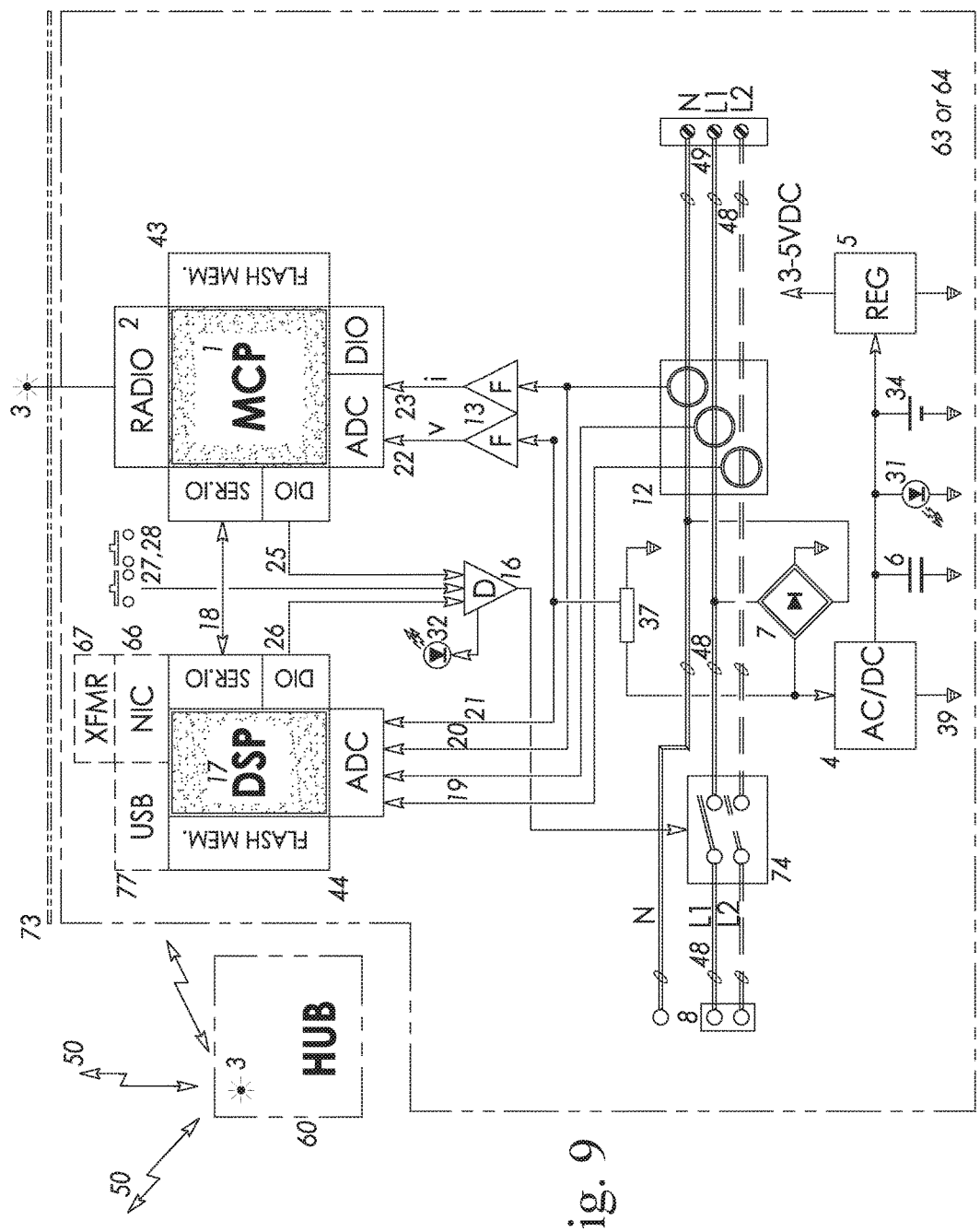

FIG. 9 depicts a block diagram for panel-mounted circuit breaker embodiments of the invention, which proposes a non-metallic door compromise to the standard metallic breaker panel to permit radio telemetry by such breakers, as an alternative to a single radio transceiver and antenna shared among a plurality of such monitoring breakers.

Figure 10:
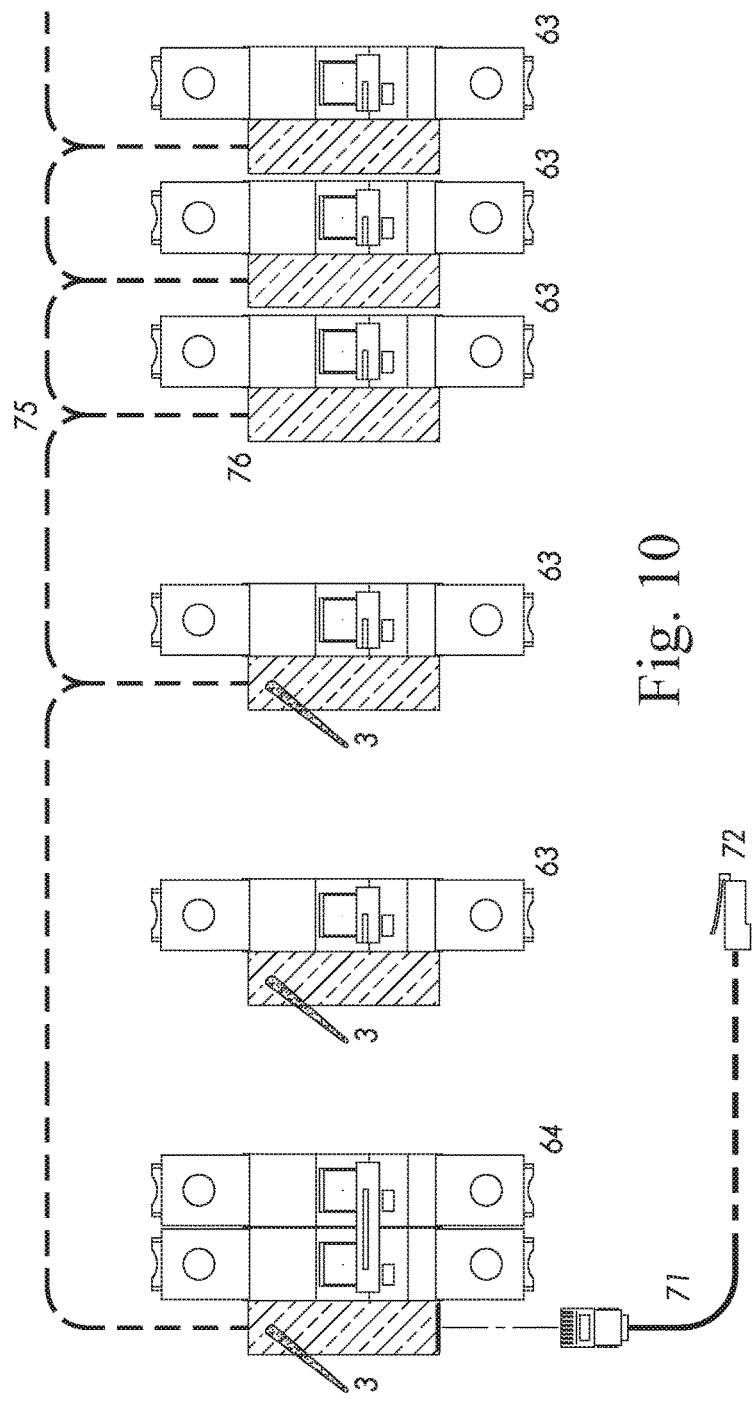

FIG. 10 depicts various arrangements for data-interconnection among a plurality of panel-mounted circuit breaker embodiments of the invention, proposing a breaker box wired data subnetwork as new art, realized for example by USB and/or Ethernet.

FIG. 11 depicts the Fixure Configuration Table in the firmware of a fixture's onboard microprocessors, to reflect a given fixture's type, size, features and functions as installed/enabled options, illustrating the versatility of the invention. The attributes comprising a certain NEMA5 fixture are marked as an example.

A further understanding of the present invention can be obtained by reference to a preferred embodiment set forth in the accompanying description. Although the illustrated embodiments are merely exemplary of methods for carrying out the present invention, both the organization and method of operation of the invention, in general, together with further objectives and advantages thereof, may be more easily understood by reference to the illustrations and the following description. The Figs. are not intended to limit the scope of this invention, but merely to clarify and exemplify the invention.

DETAILED DESCRIPTION OF THE INVENTION

In the following detailed description, reference is made to specific embodiments in which the invention may be practiced. These embodiments are described in sufficient detail to enable those skilled in the art to practice the invention. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense.

The word "exemplary" is used herein to mean "serving as an example, instance, or illustration." Any embodiment described herein as "exemplary" is not necessarily to be construed as preferred or advantageous over other embodiments. Likewise, the terms "embodiment(s) of the invention", "alternative embodiment(s)", and "exemplary embodiment(s)" do not require that all embodiments of the method(s) or apparatus include the discussed feature, advantage or mode of operation. The following description of the preferred embodiment is merely exemplary in nature and is in no way intended to limit the invention, its application, or use.

There has thus been broadly outlined the more important features of the invention in order that the detailed description thereof that follows may be better understood, and in order that the present contribution to the art may be better appreciated. There are, of course, additional features of the invention that will be described hereinafter and which will form additional subject matter. Those skilled in the art will appreciate that the conception upon which this disclosure is based may be readily utilized as a basis for the designing of other structures, methods and systems for carrying out the purposes of the present invention. It is important, therefore, that any embodiments of the present invention be regarded as including such equivalent constructions insofar as they do not depart from the spirit and scope of the present invention.

Further, the purpose of the Abstract herein is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is neither intended to define the invention of this application nor is it intended to be limiting as to the scope of the invention in any way.

Regarding the attached Figs. and Table, the following is a key listing the component numbers and the components to which they refer:

01 Micro-Controller Processor (MCP)
02 Telemetry Data Link Radio Port of MCP
03 Antenna (any buried or protruding)
04 AC-to-DC Converter
05 3-5VDC Regulator
06 Filter Capacitor
07 Bridge Rectifier
08 AC Inlet Screws, Plug, or Wires
09 AC Outlet Socket (Undimmed)
10 AC Outlet Socket (Dimmed)
11 Relay (Set/Reset Pulse-Latching)
12 Current Sensors
13 Filters (Average, RMS or Peak Detect)
14 Triac Dimmer
15 Optocoupler Triac Driver
16 Relay Drivers (Set & Reset Pulse Coil Transistors)

17 Digital Signal Processor (DSP)
18 Serial Communication MCP-DSP link (I2C, SPI, UART)
19 Voltage AC Waveform Signal from Divider
20 Neutral Current AC Signal
21 Line Current AC Signal
22 Average Voltage from Filter
23 Average Current from Filter
24 Triac Drive Signal from MCP
25 Relay trip Signal from MCP
26 Relay trip Signal from DSP
27 Trip Pushbutton and Signal
28 Reset Pushbutton and Signal
29 GFCI Test Pushbutton
30 GFCI Test Resistor
31 Power "on" Indicator LED
32 Relay "Tripped" Indicator LED
33 Dimmer Indicator LED
34 Backup Battery
35 Person-In-Room (PIR) Sensor
36 Sun (LIR) Sensor
37 AC Sensing Voltage Divider
38 Earth Ground Frame
39 Isolated Circuit Common
40 Finger Swipe Sensors
41 Zerox zero-crossing Voltage Triac Sync
42 Nightlight Control Signal
43 Flash Memory Program in MCP
44 Flash Memory Program in DSP
45 Transistors for Self-Test and Nightlight
46 GFCI Self-Test Control Signal
47 Nightlight LED(s)
48 AC Load-Current Busbars or Wires
49 AC Load or Line Terminal Screws
50 Product Encasement (generic)
51 NEMA 5-15 Plug-In Adapter embodiment
52 NEMA 5-15 Outlet In-Wall embodiment
53 NEMA 5 Finger Swipe or other wall switch
54 NEMA 14-50 A Outlet
55 NEMA 14-30 A Outlet
56 NEMA 5 Buried Monitor/control
57 NEMA 5 Buried Monitor/control
58 NEMA 5 Passive Outlet
59 NEMA 14 Passive Outlet
60 Gateway HUB in NEMA14 package
61 Passive 1P Circuit Breaker
62 Passive 2P Circuit Breaker
63 Monitoring Breaker (1P)
64 Monitoring Breaker (2P)
65 Fixed Lighting Load
66 Network Interface Controller (NIC) Port
67 Isolation Transformer and Connector (e.g. RJ45)
68 Ground Fault Detect Chip
69 GFD IC Trip Output Signal
70 Circuit Breaker Panel
71 Ethernet/BACnet Cable
72 Building BMACS Network Equipment
73 Door of Breaker Panel
74 Thermal Magnetic Circuit Breaker Core
75 Breaker Panel Subnet Network (USB)
76 Circuit Breaker Body Adaptation (as needed)
77 Multi-drop Subnet Port (USB or equivalent)

Referring now to the attached Figs. and Table, augmenting the primary function of an AC duplex wall receptacle, central to the circuitry comprising the present invention, Fixture (50), is a main Micro Controller Processor (MCP) (1), with integral or connected Radio (2) and Antenna (3), for bidirectional telemetry of data and commands to and from a Remote Hub (60), located a distance away.

Processor MCP (1) auto-loads from Flash Memory its Program (43) which auto-runs in an infinite loop until an AC Inlet (8) power cycle (loss and return) reloads and restarts it.

The MCP (1) is powered through 3-5VDC Regulator (5) by low Voltage AC-to-DC Converter (4) which maintains on Filter Capacitor (6) an unregulated DC charge adequate to drive the coils of 20 A rated pulse Relay (11), extracted by Diode Bridge (7) from the terminals of AC power Inlet (8), with respect to Isolated Circuit Common (39) which is notably NOT at the earth ground potential "E" of the Frame (38).

Notably, the Diode Bridge (7) connection to the input (line-side) of Relay (11), shown in FIG. 1, allows the AC-to-DC Converter (4) to continue providing DC power to keep MCP (1) processing and radio telemetry activity when Relay (11) has been opened, so long as inlet AC power is available.

A variation of the circuit in which Diode Bridge (7) connected to the output (load side) of Relay (11) instead of to the input (line side) of Relay (11), as depicted in FIG. 3, is required in some jurisdictions in order that the air break function of Relay (11) disconnects all loads, including the fixture's own internal AC-to-DC Converter (4), from the inlet AC power.

Either the un-switched-DC (Bridge-Before-Relay) or the switched-DC (Relay-Before-Bridge) variants may be used in either NEMA5 or NEMA14 fixture versions, as may suit regulatory needs.

In a switched-DC fixture variant (Relay-Before-Bridge), without optional Backup Battery (34) to keep MCP (1) processing and telemetry alive when Relay (11) is open, that fixture's processing and radio telemetry is lost until Reset Pushbutton (28) mechanically closes Relay (11) contacts or shunts them to restore DC power.

Referring hereafter to the un-switched DC (Bridge-Before-Relay) variant exemplified in FIG. 1, whenever AC power is present at the Inlet (8), unregulated DC power is thereby present within Fixture (50), thus the "Power On" indicator LED (31) will be illuminated and various other functions empowered.

As the primary function of the present invention, AC voltage and current from Inlet (8) are mainly delivered to the terminals of AC Outlets (9) & (10) through the contacts of Relay (11) and Current Sensors (12) monitoring Line and Neutral Currents, either separately as "L" & "N" sensors depicted in FIG. 1, and "L1" & "L2" & "N" sensors depicted in FIG. 3, or differentially and additively as "L−N" & "L+N" sensors depicted in FIG. 5.

The AC Current Waveform (21) from one Sensor (12) is time averaged (or alternately peak detected or rms-extracted) by Filter (13) and presented to an analog-to-digital converter (ADC) input (23) of MCP (1) as a slow-changing (sub-Hertz) signal "I" as the actual average current value.

In a similar manner, the AC Voltage Waveform (19) from the AC Diode Bridge (4) is dropped to a small signal level by Divider (37), and time averaged (or alternately peak-detected or rms-extracted) by a second Filter (13) and presented to a second ADC input (22) of MCP (1) as a slow-changing (sub-Hertz) signal "V" as the actual average voltage.

In the preferred circuit realization, Voltage Signal (19) is a full-wave rectified waveform, but a half-wave Bridge (7) is an alternative to a full-wave Bridge Rectifier (7). An inductor-less off-line AC-to-DC Converter (4) is also the preferred circuit realization based on a common integrated silicon device and IGBT pass transistor, fed by the same Bridge Rectifier (7).

In the case of toroidal or Rogowski Current Sensors (12) used with any of the specialized GFCI Detection Integrated Circuits (68) as exemplified in FIG. 5, the Line and Neutral load conductors are passed together through one Sensor coil (12) additively to get a sum signal waveform, and differentially (one conductor in reversed direction) through a second Sensor coil (12) to get a difference signal waveform, with the former used for energy monitoring, and the latter used for GFCI protection, and both used for AFCI protection.

In the case of Hall type current sensors as depicted in FIGS. 1 and 3, the AC load current is passed under or through an integrated circuit sensor device which generates an output small signal waveform in phase with and proportional to the AC load current.

Triac (14) is driven through Opto-Coupler (15), by a special Triac Control Line (24) of the DIO port of MCP (1), which synchronizes triac control pulses with zero crossings of the AC Voltage Waveform (19) received at its "zerox" DIO input (41), to effect dimming of lamp loads plugged into Outlet (9), or on/off control of non-dimmable loads.

Triac (14) can serve the function of load ON/Off control when Relay (11) is not installed (and jumper wires are installed in its place). When Triac (14) passes AC power fully to AC Outlet (10), "Dim" indicator LED (33) is fully illuminated; and otherwise, to the degree that AC power to Outlet (10) is throttled by Triac (14), "Dim" indicator LED (33) is reduced in brightness.

Note that without air-break Relay (11) installed, GFCI and AFCI functionality is absent, for a non-safety variation of monitoring outlet only.

Relay (11), being of pulse type, has Trip and Reset inputs which cause its contacts to open and close, respectively, which are fed from Trip and Reset Relay Drivers (16), through which the Reset Signal from Reset Pushbutton (28) may originate to turn the relay "ON" and through which the Trip Signal to turn the relay "OFF" may originate from a discrete input/output (DIO) line (25) of MCP (1) or from a DIO line (26) of an optional Digital Signal co-Processor (DSP) (17), or optional Trip/Off Pushbutton (27).

When installed, Co-Processor DSP (17) auto-loads from Flash Memory its Program (44) which auto-runs in an infinite loop until an AC Inlet power cycle event reloads and restarts it.

When installed, the continual program of DSP (17) performs fast real time analyses of AC Voltage Waveform (19) and AC Current Waveforms (20) & (21) from Sensors (12), as Signals "L" & "N" as depicted in FIG. 1, or as "L1" & "L2" & "N" as depicted in FIG. 3, or as difference and sum Signals "L−N" & "L+N" as depicted in FIG. 5.

When installed, DSP (17) reports to main controller MCP (1) the results of its analysis of current and voltage waveforms when polled by MCP (1) via a Serial Communication data channel (18) connecting the two processors' serial input/output (SERI( ) Ports.

Any such DSP (17) report to MCP (1) may variously include average, peak, or RMS current and voltage values, line & neutral current difference and sum values, current and voltage phase shift or power factor values derived from those waveforms, for comparison to, or use instead of, analog filter derived values obtained at the ADC of MCP (1).

Instantaneous power may be repetitively calculated by MCP (1) and by DSP (17), as the product of average voltage and current and the cosine of their waveform phase shift, and energy use accumulated as the repetitive summing of the product of power value and the time passage since the previous power value, namely Watt-seconds adding up to kilowatt-hours.

Values for voltage, currents, phase shift, power factor, power, energy use since last report are variously reported by Radio (2) from MCP (1) to some Remote Hub (60) for recording and display.

Each time a Fixture (50) reports accumulated energy use to a Remote Hub (60), the Fixture resets its internal accumulator, and it becomes the duty of the Remote Hub to track the time between energy use accumulator reports, to avoid the risk of accumulator overflow in the fixture's more limited microcontroller.

Additionally, a DSP (17) report to MCP (1) may include indications from waveform spectral analysis of arc fault or ground fault anomalies, for radio reporting in turn by MCP (1) to Remote Hub (60) for recording and display.

When Relay (11) and DSP (17) are installed, the GFCI and/or AFCI protection feature commonly required in certain installations may therefore be provided by this energy monitoring device, if this feature is so enabled.

A GFCI test feature may be provided in support of this feature, consisting of a GFI Test Resistor (30), sized to allow a leakage current flow of 5 milliamps, which is momentarily connected between Line and Earth terminals of Outlet (9) by a manual push of GFI Test Button (29), which should result in the opening of Relay (11) contacts.

A Ground Fault Detection Integrated Circuit (GFD IC or GFD chip) (68) such as is a standard component of many known GFCI outlets and circuit breakers, fed by a differential Current Sensor (12) as is common practice in such present art GFCI products, can provide a "trip" Signal (69) via Driver (16) to turn "off" Relay (11) or Thermal Magnetic Circuit Breaker Core (74), upon a ground fault, as a preferred alternative to ground fault detection by processor firmware or other dedicated signal analysis methods.

Once the Relay (11) contacts are opened, until commanded again to close, the "Trip" indicator LED (32) will stay illuminated. An auxiliary contact of Relay (11) can be added to provide true state indication to an input of MCP (1).

An automatic self-test routine can be run periodically by DSP (17) by driving Self-Test output line (46) from its DIO Port to gate a Self-Test MOSFET transistor (45) across the GFI Test Pushbutton (29) to conduct leakage current through GFI Test Resistor (30).

During a self-test procedure, DSP (17) will verify but intercept its own internal trip signal, preventing that signal from actually being output from DSP (17) thru Driver (16) to cause Relay (11) contacts to open, thereby confirming the GFI functionality without actually interrupting power to any AC load.

When installed, Person-in-Room (PIR) Sensor (35) detects an empty room versus movement (ultrasound sensory embodiment) or body warmth (IR-sensory embodiment) which can be used by MCP (1) to turn Outlet (10) (or both Outlets (9) & (10)) "off" or "on" respectively using Triac (14) (or Relay (11)).

When installed, the Light-In-Room (LIR) or Sun Sensor (36) detects loss of room light to cue MCP (1) (or DSP (17)) via a DIO input line to turn Outlet (10) (or both Outlets (9) & (10)) "off" or "on" respectively using Triac (14) (or Relay (11)).

When installed, the Nightlight (47) can be turned "on" or "off" instead or in addition to Outlet(s) as aforementioned, for safety and convenience, via a control line (42) from DIO port of either MCP (1) or DSP (17), based on time of day, and/or the state of PIR sensor (35), and/or the state of Sun Sensor (36), as user-configured via a setup command from a Remote Hub (60).

When Backup Battery (34) is also installed, Nightlight (47) can also be configured to function as a safety feature during utility power loss events, based on loss of Inlet (8) voltage detected by MCP (1) or DSP (17). In this case, the power "on" LED (31) is lit until Battery (34) is drained and no voltage is present at AC Inlet (8).

Configuration of features in a given Fixture (50) is a mix of fixed parameters set during manufacturing, and variable parameters set by Setup Commands from a Remote Hub (60). These setup parameters are defined in Table One, which is marked to also show the particular settings of an example NEMA5 fixture.

The many identical fixtures in a given building may be configured differently, and it is the duty of the Remote Hub (60) to maintain a record of which features are enabled on each fixture it commands.

Hub (60) may comprise any computer, even a laptop or tablet, but preferred embodiments fit in a dual-gang wall box as depicted in FIG. 4, and may be an adaptation of a micro-ITX single-board PC, or any ARM or similar embedded microcontroller conforming to the block diagram of FIG. 7 with these provisions:

The same Radio facility (2) with similar or superior Antenna (3) as the fixtures with which it is expected to communicate;

An AC-to-DC power conversion circuit (4), (5), (6), or (7) similar to that of the fixtures, to power the computer or microcontroller;

Optionally a Voltage Divider (37) and Filter (13) producing average Voltage Signal (22) to an analog input (ADC port) of MCP (1), and Backup Battery (34), together allowing "keep-alive" during a power loss;

A network interface controller (NIC) Port (66) and network Jack with isolation transformer (67) to connect a building network cable; and Software or firmware to perform the necessary protocol bridge between the submetering network of this invention and the building network suited to NIC (66) and Jack (67).

Gateway HUB (60) is connected to a building management automation and control system (BMACS) network equipment (72) via a CAT5/BACnet cable (71).

FIG. 9 shows an integration of the components and functions of this invention into standard panel-mounted circuit breakers (63) (single-pole) and (64) (multiple-pole) to provide monitoring, control and fault protection of a branch of, say, one or more ordinary Outlets (58) (NEMA5) or (59) (NEMA14) or lighting loads (65).

Any of the above variations may employ two separate microprocessors MCP (1) and DSP (17) or a single device combining the functionality shown as separated into two devices. In the preferred embodiments, the two co-processors each serve as a watchdog timer for the other to detect processor fault as a safety provision.

FIG. 10 shows a wired Subnet Serial Bus (75) (USB or equivalent) and associated Port (77) included in the invention in FIG. 9 as an alternative to separate wireless Radio (2) and Antenna (3) per Circuit Breaker (63) or (64) in a Panel (70), intending sharing of the wireless faculty of a single Circuit Breaker (63) or (64), or sharing of the Ethernet Port (66) of a single Circuit Breaker (63) or (64) so endowed.

If either processor ceases to execute its program loop for whatever reason, the other processor will detect this as a cessation of heartbeat messages; either processor can trip the AC Relay (11) OFF in response by Signals (25) and (26). Only the radio-endowed MCP (1) or the manual Pushbutton (27) can restore Relay (11) power to ON.

Messages between co-processors MCP (1) and DSP (11) may be carried by I2C, SPI, UART or other conventional bidirectional serial communication bus scheme, likely with radio-enabled MCP being the master which polls the DSP which is the slave.

DESCRIPTION OF EMBODIMENTS

FIG. 2 depicts the following representative embodiments of the electric circuit components and functionality comprising the fixtures of the invention variously depicted in FIGS. 1, 3, and 5; NEMA 5-15 Plug-In Adapter (51); NEMA 5-15 (or 20) Duplex Outlet (52); NEMA 5 Touch (or Buried) Wall Switch (53); NEMA 14-50 Stove (or Car) Outlet (54); and NEMA 14-30 Dryer Outlet (55).

FIG. 4 depicts various single-pole and two-pole breaker panel branch circuit applications of the above fixtures in combination with the following monitoring and non-monitoring (Passive) fixtures and loads. The intended usage is shown for NEMA5 Buried Monitor (56); NEMA14 Buried Monitor (57); NEMA5 Passive Outlet (58); NEMA14 Passive Outlet (30 A or 50 A) (59); NEMA14 Gateway HUB (60); Passive 1P Breaker (61); Passive 2P Breaker (62); monitoring 1P Breaker (63); monitoring 2P Breaker (64); and any lighting fixture (65).

The relocate-able plug-in Adapter (51) allows temporary installation without tools. One NEMA5 Outlet (52) or Wall Switch (53) or Buried Monitor (56) fit in a 2×4" standard "single gang" US wall box or two-abreast in a 4×4" standard "double-gang" US wall box. One NEMA14 Outlet (54), (55) or Buried Monitor (57) fits in a 4×4" standard "double-gang" US wall box.

Various standard wall-bezel cover plates fit the outlets and wall switches as shown in FIG. 2, or a blank wall-cover plate or hidden box cover conceals a "buried" control/monitor embodiment of the invention.

The outlets, wall switches, and buried switch/monitor embodiments of the invention at the same NEMA size and ampacity may all utilize the same circuitry and components. Certain components of the NEMA14 embodiments of the invention are of greater ampacity than those of the NEMA5 embodiments but all the embodiments comprise the same core and optional components and functionality.

The Wall-Switch embodiment (53) may optionally present a paddle or toggle type operator, or a touch operator that responds to a finger swipe gesture. In any case, a pulse-coded thru-beam optical sensor device pair (36) is suggested to adapt widely varied styles of operator mechanism with the same circuit components.

As depicted in FIG. 2, the novel use of a plurality of such a common broken-beam optical sensor to effect a finger-swipe gesture sensing device is itself new art, particularly enabled by the present invention and applicable to its NEMA5 embodiment (53).

The NEMA5 and NEMA14 embodiments of behind-the wall buried monitor/control fixture serve to switch a one-pole or two-pole load, respectively, by remote action only, requiring no inline wall switch hand operator.

FIG. 10 depicts a plurality of panel-mounted circuit breaker embodiments of the invention, variously equipped with wireless (e.g. Z-Wave, Bluetooth, Wi-Fi, or other radio) or wired networking (e.g. Ethernet/BACnet) or serial bus (e.g. USB), facilities, or any combination thereof.

One or more monitoring Breakers (63) and (64) may be endowed with a Radio transceiver (2) and Antenna (3) to be shared among a plurality of such monitoring breakers interconnected by a Subnetwork (75) such as USB or other multi-drop serial bus. Alternately, one or more monitoring breakers may be endowed with an Ethernet NIC (66) for connection by Network Cable (71) to other wired Building Data Equipment (72), to thereby serve in the manner of the Gateway Hub (60) for all the monitoring breakers within that Panel (70).

The addition of multi-drop serial bus (USB) and Ethernet or other network facilities within circuit breaker panels represents a new art, with a preferred embodiment embedding a data wiring "backplane" in a breaker panel adjacent to the load current busses already commonplace.

New standards for panel-mount circuit breaker width and spacing may arise to accommodate the added components, functionality and connectivity of this invention, depicted in FIG. 10 as an added package thickness (76) for monitoring Breakers (63) (1P) and (64) (2P) compared with non-monitoring Breakers (61) and (62).

Those skilled in the art will appreciate that the conception, upon which this disclosure is based, may readily be utilized as a basis for designing other structures, methods, and systems for carrying out the several purposes of the present invention. It is important, therefore, that this description be regarded as including such equivalent constructions insofar as they do not depart from the spirit and scope of the present invention.

Although certain example methods, apparatus, apparatus and articles of manufacture have been described herein, the scope of coverage of this application is not limited thereto. On the contrary, this application covers all methods, apparatus and articles of manufacture fairly falling within the scope of the invention either literally or under the doctrine of equivalents.

Therefore, the foregoing is considered as illustrative only of the principles of a method for creating assignments in an incident command system. Further, since numerous modifications and changes will readily occur to those skilled in the art, it is not desired to limit the method for creating assignments in an incident command system to the exact construction and operation described, and accordingly, all suitable modifications and equivalents may be resorted to, falling within the scope of the present invention. While the above description describes various embodiments of the present invention, it will be clear that the present invention may be otherwise easily adapted to fit other configurations.

As various changes could be made in the above constructions without departing from the scope of the invention, it is intended that all matter contained in the above description shall be interpreted as illustrative and not in a limiting sense.

What is claimed is:

1. An energy monitoring device enclosed in an electrical wall outlet incorporating load current telemetry measurement circuits comprising:
   one or more microcontrollers with analog filtering and digitizing input circuitry and firmware, connected to load current and voltage sensing devices which together effect sampled measurement of load current and voltage waveforms or their peak, average or rms values;
   microcontroller communication circuitry and firmware to facilitate wired or wireless telemetry to remote equipment of said current and voltage sampled measurements; and
   AC load current conductors, terminals and connectors, and a diode bridge, ac-to-dc converter, filter capacitor, and regulator needed to extract power for said microcontrollers), sensors and telemetry circuits;
   a load current interrupting circuit device including:
      relay contacts to make and break the conductive path between one or more line and load side conductors, which are integral to a thermal-magnetic circuit breaker, and which are either before or after the bridge feeding internal DC supply power;
      microcontroller(s) with output circuitry and firmware, or other specialized device, connected by driver circuitry to the coils of said relay or circuit breaker, to effect make and break control of its contacts; and
      microcontroller communication circuitry and firmware to facilitate wired or wireless telemetry from remote equipment to command said make and break actions of said relay or circuit breaker;
   a telemetric ground fault current interrupting (GFCI) protection including:
      microcontroller(s) with input circuitry and firmware, or other specialized fault detection device, connected to current sensing devices which together detect a ground fault load conditions, of a non-zero sum of all terminal currents defined as exceeding five (5) milliamps; and
      microcontroller communication circuitry and firmware to facilitate telemetry to remote equipment of notice in event of interruption action by said GFCI protection feature; and
   telemetric arc fault Current interrupting (AFCI) protection including:
      microcontroller(s) with input circuitry and firmware, or other specialized fault detection or waveform filtering device, connected to voltage and current sensing devices which together detect series and parallel arcing fault load conditions, by spectral analysis to identify high frequency signature of said arc phenomena; and
      microcontroller communication circuitry and firmware to facilitate telemetry to remote equipment of notice in event of interruption action by said AFCI protection feature;
   in which the energy monitoring device encloses the one or more microcontrollers, the microcontroller communication circuitry and firmware, and the AC load current conductors, terminals and connectors, and the diode bridge, ac-to-dc converter, filter capacitor, regulator, load current interrupting circuit device, telemetric ground fault current interrupting (GFCI) protection, telemetric arc fault Current interrupting (AFCI) protection which are disposed in an electrical wall box covered with a standard wall-bezel cover plate.

2. The energy monitoring device enclosed in an electrical wall outlet incorporating load current telemetry measurement circuits of claim 1 further comprising an automatic and telemetric self-test circuit including:
   self-test circuitry to test the fault circuit interrupter by switching a test resistor from either load conductor to earth to cause a detectable fault current flow temporarily;
   microcontroller output circuitry and firmware connected by driver circuitry to said self-test circuit to effect control of said self-test circuitry;

microcontroller input circuitry and firmware connected to a pushbutton, or a Pushbutton connected directly to the test resistor, to manually initiate said self-test actions at-will;

microcontroller firmware recognition of said self-test pass or fail, causing said relay contacts to break when said self-test fails but not when it passes; and microcontroller communication circuitry and firmware to facilitate telemetry to remote equipment of said self-test result, and telemetry from remote equipment to command said self-test actions.

3. The energy monitoring device enclosed in an electrical wall outlet incorporating load current telemetry measurement circuits of claim 1 further comprising a telemetric dimming circuit including:

one or more triac or equivalent semiconductor devices to modulate load current, in synchrony with line voltage waveform zero-crossings, to vary conduction from 0 to 100 percent;

microcontroller(s) with output circuitry and firmware, or other specialized device, connected by optocoupler driver circuitry to the gate of said triac to effect control of its conduction; and microcontroller communication circuitry and firmware to facilitate wired or wireless telemetry from remote equipment to command said triac conduction from zero to full.

4. The energy monitoring device enclosed in an electrical wall outlet incorporating load current telemetry measurement circuits of claim 1 further comprising one or more sockets to receive load plugs of any type, including NEMA-5 or NEMA-14.

5. The energy monitoring device enclosed in an electrical wall outlet incorporating load current telemetry measurement circuits of claim 1 further comprising a manual operator mechanism including:

microcontroller input circuitry and firmware connected to one or more optical thin-beam sensing devices, or other finger sensing or other contact switching mechanisms, which together detect and effect manual control to make or break load current at-will;

a plurality of said sensing devices to translate finger "swipe" gestures into commands to make, break, brighten, or dim a lighting load, effecting coordinated control of a triac; and microcontroller communication circuitry and firmware to facilitate telemetry to remote equipment of notice of each make, break or dimming or brightening action invoked by said manual operator feature.

6. The energy monitoring device enclosed in an electrical wall outlet incorporating load current telemetry measurement circuits of claim 1 further comprising a NEMAS-15 male plug, or wire pigtails, or screw terminals, or cage-clamp terminals, for AC line infeed connection.

7. The energy monitoring device enclosed in an electrical wall outlet incorporating load current telemetry measurement circuits of claim 1 further comprising wire pigtails or screw or cage-clamp terminals for AC load current connection.

8. The energy monitoring device enclosed in an electrical wall outlet incorporating load current telemetry measurement circuits of claim 1 further comprising a built-in telemetric night-light or safety-light including:

one or more bulbs or light emitting diodes (LEDs) or other light sources arrayed in any color to illuminate an area;

microcontroller output circuitry and firmware connected by driver circuitry to said bulb(s) or LED(s) to turn them off or illuminate them fully or partially by any modulation; and microcontroller communication circuitry and firmware to facilitate wired or wireless telemetry from remote equipment to command said off or full or partial illumination of said light source.

9. The energy monitoring device enclosed in an electrical wall outlet incorporating load current telemetry measurement circuits of claim 1 further comprising a telemetric backup battery including:

rechargeable chemical cell and charge control circuitry to permit some period of continued telemetry after loss of AC line power, in Bridge-After-Relay fixture designs; and microcontroller communication circuitry and firmware to facilitate wired or wireless telemetry to remote equipment of notice of changes in state-of-charge or "on backup" status.

10. The energy monitoring device enclosed in an electrical wall outlet incorporating load current telemetry measurement circuits of claim 1 further comprising a person-in-room sensor including:

microcontroller input circuitry and firmware connected to one or more infra-red, acoustic, motion, or other type of sensor to detect presence or absence of a person in its vicinity; and microcontroller communication circuitry and firmware to facilitate wired or wireless telemetry to remote equipment of notice of changes in detection of empty/occupied room state.

11. The energy monitoring device enclosed in an electrical wall outlet incorporating load current telemetry measurement circuits of claim 1 further comprising an in-built telemetric room ambient light sensor including:

microcontroller input circuitry and firmware connected to one or more photovoltaic or photo-resistive device or other ambient light level or presence/absence sensing device; and microcontroller communication circuitry and firmware to facilitate wired or wireless telemetry to remote equipment of notice of changes in said light level or presence/absence state.

12. The energy monitoring device enclosed in an electrical wall outlet incorporating load current telemetry measurement circuits of claim 1 further comprising a one-pole or multi-pole panel circuit breaker.

13. The energy monitoring device enclosed in an electrical wall outlet incorporating load current telemetry measurement circuits of claim 1 further comprising a Universal Serial Bus (USB) or other multi-drop serial subset adapter and associated driver firmware and cable or backplane connector.

14. The energy monitoring device enclosed in an electrical wall outlet incorporating load current telemetry measurement circuits of claim 1 further comprising an Ethernet or other network interface controller (NIC) device, associated cable jack/transformer, and client-server software arranged to pipe to remote equipment, the measurement data and control of a plurality of the energy monitoring devices enclosed in an electrical wall outlet.

15. The energy monitoring device enclosed in an electrical wall outlet incorporating load current telemetry measurement circuits of claim 1 further comprising a network gateway hub including a microcomputer system equipped with the voltage monitoring and wired or wireless telemetry devices, and a USB or other serial subset port, and an Ethernet or other NIC port, with client-server software arranged to pipe to remote equipment, the measurement data and control of a plurality of the energy monitoring devices enclosed in an electrical wall outlet.

16. The energy monitoring device enclosed in an electrical wall outlet incorporating load current telemetry measurement circuits of claim 1 in which the wall box is a single gang wall box.

17. The energy monitoring device enclosed in an electrical wall outlet incorporating load current telemetry measurement circuits of claim 1 in which the electrical wall outlet includes a front cover substantially parallel to a back cover and substantially orthogonal to four sides, enclosing an interior to house both low voltage sensing/control circuitry and AC power socket/switching circuitry, and providing a plurality of line terminals for connecting the device to the wires of an AC power source, and a plurality of load terminals for connecting the device to the wires or plugs of AC loads.

* * * * *